(12) United States Patent  (10) Patent No.: US 9,323,611 B2
Chilappagari et al.  (45) Date of Patent: Apr. 26, 2016

(54) SYSTEMS AND METHODS FOR MULTI-STAGE SOFT INPUT DECODING

(71) Applicant: Marvell World Trade Ltd., St. Michael (BB)

(72) Inventors: Shashi Kiran Chilappagari, San Jose, CA (US); Gregory Burd, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/197,426

(22) Filed: Mar. 5, 2014

(65) Prior Publication Data

US 2014/0289584 A1 Sep. 25, 2014

Related U.S. Application Data

(60) Provisional application No. 61/803,894, filed on Mar. 21, 2013.

(51) Int. Cl.
H03M 13/00 (2006.01)
G06F 11/10 (2006.01)
H03M 13/11 (2006.01)
H03M 13/37 (2006.01)
H04L 1/00 (2006.01)

(52) U.S. Cl.
CPC ....... G06F 11/1068 (2013.01); H03M 13/1108 (2013.01); H03M 13/1111 (2013.01); H03M 13/3707 (2013.01); H04L 1/0052 (2013.01); H03M 13/1128 (2013.01)

(58) Field of Classification Search
CPC ............ G06F 11/1068; G06F 11/1048; G06F 11/1008; H03M 13/1128; H03M 13/1111; H03M 13/3707; H03M 13/1108; H03M 13/45; H03M 13/451; H03M 13/458; H03M 13/6331; H04L 1/0052; G11C 16/26; G11C 29/844; G11C 11/5642; G11C 16/10
See application file for complete search history.

(56) References Cited

U.S. PATENT DOCUMENTS

| 8,312,354 | B1 | 11/2012 | Varnica et al. |
| 8,443,267 | B2 * | 5/2013 | Zhong et al. ................ 714/780 |
| 8,495,453 | B1 | 7/2013 | Varnica et al. |
| 8,694,868 | B1 | 4/2014 | Chilappagari et al. |
| 8,819,530 | B1 | 8/2014 | Yeo et al. |
| 8,862,970 | B1 | 10/2014 | Varnica et al. |

(Continued)

FOREIGN PATENT DOCUMENTS

WO WO-2009072103 A2 6/2009

OTHER PUBLICATIONS

"VLSI Implementation of a High-Throughput Soft-Bit-Flipping Decoder for Geometric LDPC Codes", Junho Cho et al, IEEE Transactions on Circuits and Systems I: Regular Papers 57:5, May 1, 2010, pp. 1083-1094.

(Continued)

*Primary Examiner* — Guerrier Merant

(57) ABSTRACT

Systems and methods are provided for decoding data. A first decoder attempts to decode the data based on a hard decision input for a symbol. When the attempt to decode the data based on the hard decision input fails, a request is transmitted reliability information for the symbol. Receiving circuitry receives the reliability information for the symbol, and a second decoder decodes the data based on the reliability information.

20 Claims, 5 Drawing Sheets

(56) References Cited

U.S. PATENT DOCUMENTS

| | | |
|---|---|---|
| 8,910,028 B1 | 12/2014 | Li et al. |
| 8,930,797 B2 * | 1/2015 | Haratsch ...................... 714/780 |
| 8,938,660 B1 | 1/2015 | Varnica et al. |
| 8,984,378 B1 | 3/2015 | Chilappagari et al. |
| 9,003,267 B2 | 4/2015 | Varnica et al. |
| 9,009,578 B1 | 4/2015 | Varnica |
| 9,065,484 B2 | 6/2015 | Sandberg et al. |
| 9,083,383 B1 | 7/2015 | Tunali et al. |
| 2005/0166129 A1 * | 7/2005 | Yano et al. .................... 714/797 |
| 2006/0190797 A1 | 8/2006 | Xin |
| 2009/0177931 A1 * | 7/2009 | Song et al. .................... 714/704 |
| 2009/0234792 A1 * | 9/2009 | Kim et al. ....................... 706/50 |
| 2010/0037121 A1 | 2/2010 | Jin et al. |
| 2010/0077279 A1 * | 3/2010 | Kim et al. ..................... 714/755 |
| 2010/0275096 A1 * | 10/2010 | Zhong et al. .................. 714/758 |
| 2011/0191653 A1 | 8/2011 | Zeng et al. |
| 2011/0246849 A1 | 10/2011 | Rault et al. |
| 2012/0079355 A1 * | 3/2012 | Patapoutian et al. ......... 714/780 |
| 2012/0224420 A1 * | 9/2012 | Sakurada et al. ........ 365/185.03 |
| 2012/0240007 A1 | 9/2012 | Barndt et al. |
| 2012/0317462 A1 | 12/2012 | Liu et al. |
| 2013/0073922 A1 | 3/2013 | Varnica et al. |
| 2013/0139035 A1 * | 5/2013 | Zhong et al. .................. 714/773 |
| 2013/0173985 A1 * | 7/2013 | Chung et al. ................. 714/755 |
| 2013/0173988 A1 | 7/2013 | Chen et al. |
| 2013/0305114 A1 * | 11/2013 | Olcay et al. .................... 714/755 |
| 2014/0108883 A1 | 4/2014 | Tehrani et al. |
| 2014/0164886 A1 | 6/2014 | Grieb et al. |
| 2014/0245098 A1 | 8/2014 | Sharon et al. |
| 2014/0289584 A1 | 9/2014 | Chilappagari et al. |
| 2015/0169406 A1 | 6/2015 | Li et al. |
| 2015/0220389 A1 | 8/2015 | Kim et al. |

OTHER PUBLICATIONS

"An Improvement on the Modified Weighted Bit Flipping Decoding Algorithm for LDPC Codes", Ming Jiang et al, IEEE Communications Letters 9:9, pp. 814-816.

International Search Report and Written Opinion issued Apr. 1, 2014 in International Application No. PCT/US2014/014697.

International Preliminary Report on Patentability and Written Opinion dated Sep. 17, 2015 in International Application No. PCT/US2014/020775.

International Search Report and Written Opinion dated Jul. 7, 2014 in International Application No. PCT/US2014/020775.

International Search Report and Written Opinion dated Aug. 7, 2014 in International Application No. PCT/US2014020644.

International Search Report and Written Opinion dated Aug. 7, 2014 in International Application No. PCT/US2014/020644.

* cited by examiner

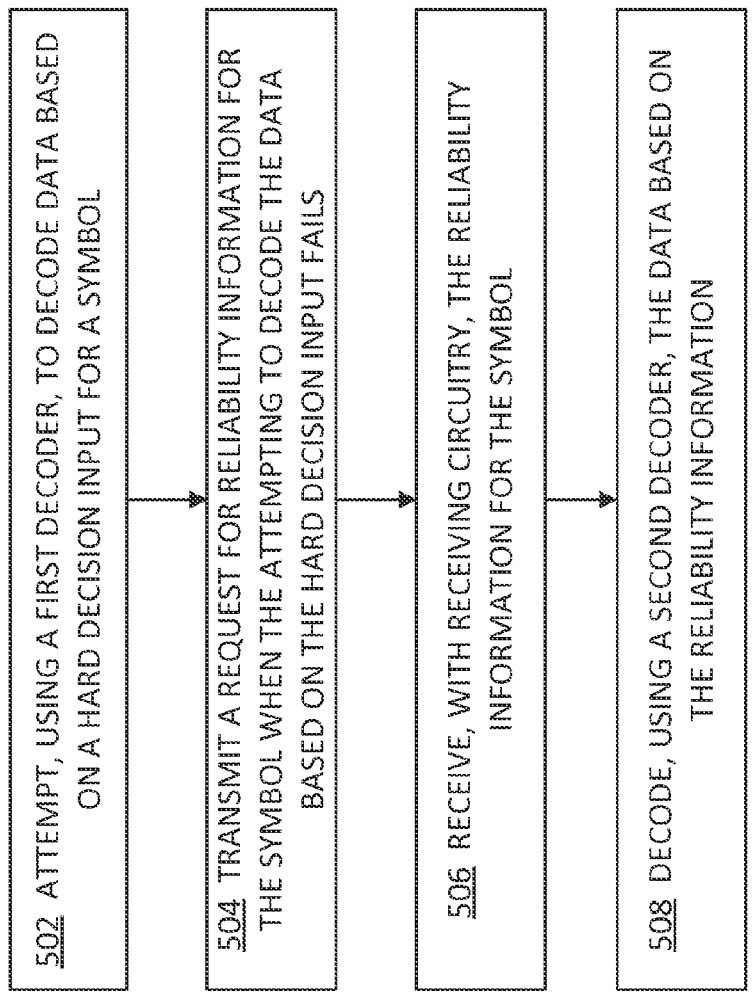

SYSTEMS AND METHODS FOR MULTI-STAGE SOFT INPUT DECODING

CROSS REFERENCE TO RELATED APPLICATIONS

This disclosure claims the benefit under 35 U.S.C. §119(e) of U.S. Provisional Application No. 61/803,894, filed on Mar. 21, 2013, which is incorporated herein by reference in its entirety.

FIELD OF USE

This disclosure relates generally to data decoding, and more particularly to multi-stage decoders in flash controllers with soft inputs.

BACKGROUND

Data storage, satellite communications, wireless communications, wire-line communications, and power-line communications are applications that may each use codes such as LDPC codes to encode and decode data. Devices such as digital camera flash memory storage, satellites, mobile phones, and other mobile devices may also each use LDPC codes and LDPC decoders.

Error correction codes are used to fix errors in information transmitted in a noisy data storage or communications channel. The information may be encoded (by a LDPC encoder) prior to transmission and then subsequently decoded (by a LDPC decoder) when received. LDPC codes are one of the best performing error correction codes, along with Turbo codes, for use in correcting errors in information transmitted on communication and data storage channels.

Conventional hard decoding LDPC techniques typically determine whether to flip a bit or update the value of a symbol based only on whether a given number of checks are unsatisfied. For example, values of one or more symbols may be selected to be updated based on which combination of updated symbols is most likely to reduce the number of unsatisfied check nodes.

SUMMARY

In accordance with an implementation of the disclosure, systems and methods are provided for decoding data. A first decoder attempts to decode the data based on a hard decision input for a symbol. When the attempt to decode the data based on the hard decision input fails, a request is transmitted reliability information for the symbol. Receiving circuitry receives the reliability information for the symbol, and a second decoder decodes the data based on the reliability information.

In some implementations, when the first decoder's attempt to decode the data based on the hard decision input for the symbol fails, the hard decision input for the symbol may be discarded, and a request may be transmitted for another hard decision input. In some implementations, when the first decoder's attempt to decode the data based on the hard decision input for the symbol fails, the hard decision input is stored in memory.

In some implementations, the second decoder decodes the data based on the hard decision input and the reliability information. In some implementations, the hard decision input for the symbol is received after an instruction to perform a read operation on a memory is transmitted. The reliability information is obtained by performing one or more additional read operations on the memory. In some implementations, the reliability information includes at least two bits.

In accordance with an implementation of the disclosure, a system comprises a first decoder, a transmitter, a receiver, and a second decoder. The first decoder is configured to attempt to decode the data based on a hard decision input for a symbol. The transmitter is configured to transmit a request for reliability information for the symbol when the first decoder's attempt to decode the data based on the hard decision input fails. The receiver is configured to receive the reliability information for the symbol. The second decoder is configured to decode the data based on the reliability information.

In some implementations, the hard decision input for the symbol is received after an instruction is transmitted to perform a read operation on a memory. The memory is a NAND flash memory. In some implementations, the reliability information is obtained by performing one or more additional read operations on the memory.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 5 is a flow chart of an illustrative process for multi-stage decoding, in accordance with an embodiment of the present disclosure.

DETAILED DESCRIPTION

This disclosure generally relates to performing decoding at a decoder. To provide an overall understanding of the disclosure, certain illustrative embodiments will now be described, including a multi-stage decoder that performs decoding based on hard decision inputs and optionally soft information. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

In some communication systems, such as certain flash memory units, data estimates (or hard decision data) are made available to a decoder before reliability data regarding the hard decisions is available. Rather than forcing a soft decoder to wait until both the hard decisions and reliability data are available before decoding begins, the systems and methods described herein allow decoding in multiple stages. The decoding systems and methods of the present disclosure perform hard decoding in a first stage, when the hard decisions are available. If the decoding at the first stage fails, a request may be transmitted for reliability information, and decoding may be attempted at a second stage that uses a combination of the hard decision and the reliability information.

Figure 1:
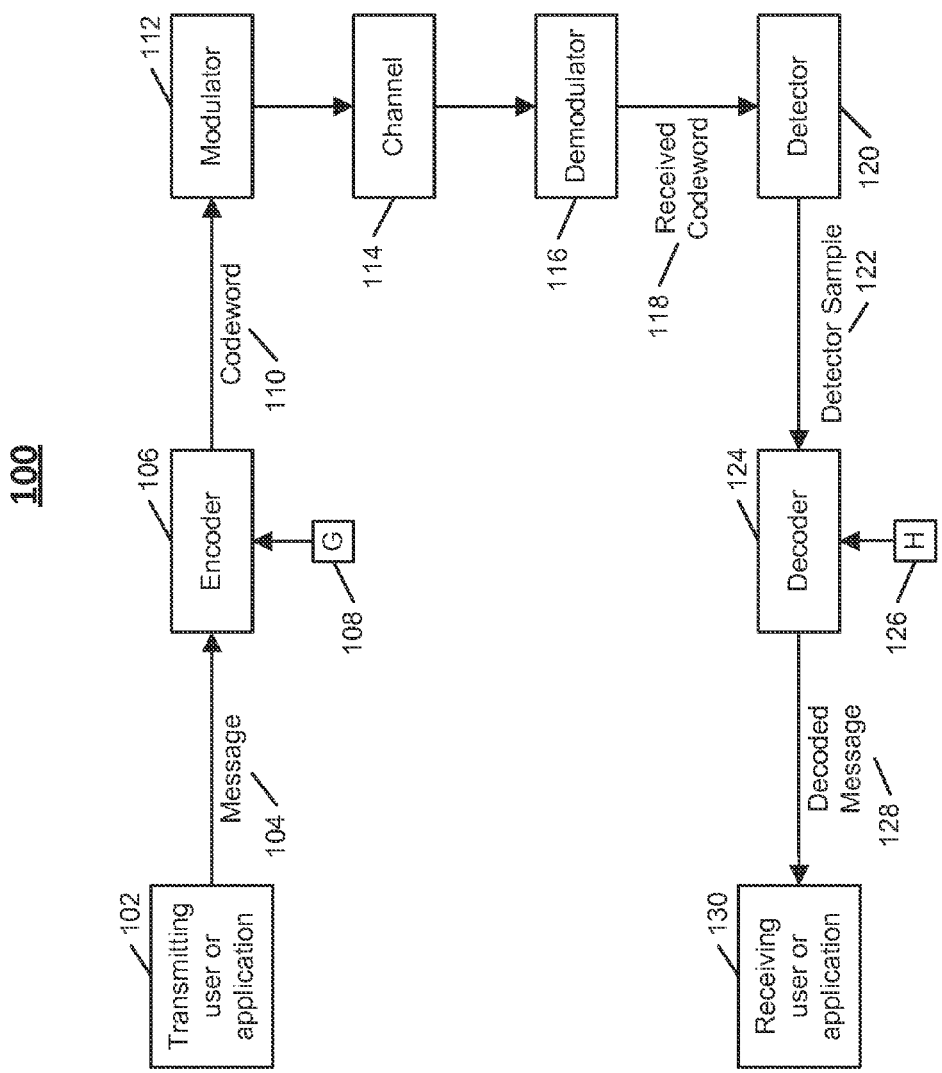
FIG. 1 is a block diagram of an illustrative communications system employing LDPC decoding, in accordance with an embodiment of the present disclosure.

FIG. 1 shows an illustrative communications system 100 for decoding based, in part, on reliability inputs, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication:

$$\underline{c} = G \underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment, or a communications channel that represents the wireless propagation environment in a wireless communications environment. Various characteristics of the channel 114 may corrupt data that is communicated or stored thereon. For example, the channel 114 may be a non-ideal memoryless channel or a channel with memory; the channel 114 may be an erasure channel, and may be symmetric or asymmetric. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which may be an estimate of the original data message 104, also referred to herein as one or more hard decisions. The detector 120 samples each symbol in the received codeword 118 and assigns each symbol to a bin based on the symbol's value. In some embodiments, the bin is assigned based on a probability distribution. Each symbol sampled by the detector 120 may be assigned to one of two or more possible bins or states. The states that are determined for the detector sample 122 are stored in memory as the sample codeword. This memory is termed the "hard decision memory," which may be in a different memory location from the received codeword 118.

In some embodiments, the channel 114 is read multiple times, and the multiple reads may be processed jointly or separately by the demodulator 116, the detector 120, or both to generate reliability data in addition to the hard decision sample codeword. For example, to determine the input state of a given symbol stored in a flash memory storage device, the memory cell in which the received value of the symbol is stored may be read more than once. Multiple reads of the channel 114 corresponding to the same symbol may be processed by the detector 120 to generate detector sample 122 in the form of reliability data and hard decision data. For example, in a binary code, multiple reads of the channel 114 may be processed by the demodulator 116, the detector 118, or both to generate one bit of hard decision data and one bit of reliability data for each bit in the sample codeword. In another example, two bits of reliability data may be generated for each bit in the sample codeword. In general, any number of bits of reliability data may be generated for each bit in the sample codeword. Such reliability data may be stored in a "reliability data memory" location that is separate from the hard decision memory, or may be stored together with the hard decisions in the same memory location. Both hard decision and reliability data in the form of detector sample 122 are transmitted to a decoder 124 as input for subsequent decoding operations.

The decoder 124 receives and iteratively processes the detector sample 122 in multiple stages. The detector 120 and the decoder 124 may be two separate processors, or a single processor may be used as both the detector 120 and decoder 124. In general, the decoder 124 comprises control circuitry and/or decoding circuitry used to iteratively correct and/or detect errors present in the detector sample 122, for example, due to transmission through the channel 114. In some embodiments, the decoder 124 uses a parity check matrix H 126 and a decoding technique to produce a decoded message 128. As an example, the decoder 124 is an LDPC decoder. In general, LDPC decoding can be described using a mathematical vector model $H\underline{c} = \vec{0}$, in which c is a binary string of length n and H is the parity check matrix H 126, which is a lowdensity, sparse n×m matrix, wherein, as above, n is the number of symbols in the codeword, m is the number of check nodes satisfying and m≥n−k is the number of symbols in the message. The model is satisfied only when the binary string c is the codeword c 110. The parity check matrix H 126 is not necessarily unique, and may be chosen to be computationally convenient, to decrease the number of errors generated by the decoding technique of the decoder 124, or both. While LDPC decoding is described in detail herein, one of ordinary skill in the art will understand that the present disclosure is applicable to any coding scheme that is capable of decoding using soft information, such as Turbo codes, trellis coded modulation schemes, or any other suitable coding schemes.

In accordance with the present disclosure, the decoder 124 may be configured to process detector samples 122 by updating symbols, reliability data, or both based on one or more "update rules." In an example, an update rule may be based on whether checks of the symbol are satisfied or unsatisfied, whether the symbol has been previously updated, flipped, or toggled, based on the value of the reliability data, or a suitable combination thereof. Generally, as used herein, "flipping" or "toggling" a symbol means to update a value of the symbol to a different value than the current value. The update rules and system architectures for performing the symbol flipping or toggling are described in Varnica et al. U.S. patent application Ser. No. 14/172,420, filed Feb. 4, 2014, which is hereby incorporated by reference herein in its entirety.

Moreover, the decoder 124 may use a multi-stage decoding technique, in which a first stage may be used to perform hard decoding, and a second stage following the first stage may be used to perform soft decoding. In particular, some communications systems, such as certain flash memory units, make data estimates (or hard decision data) available to a decoder before reliability data regarding the hard decisions is available. Rather than forcing a soft decoder to wait until both the hard decisions and reliability data are available before decoding begins, the decoder 124 may perform decoding in multiple stages. The first stage performs hard decoding, when the hard decisions are available. Later, when the reliability data is available, soft decoding is performed in a second stage that makes use of both the hard decisions and the reliability data. Optionally, additional soft decoding stages are used as incoming reliability data is received. Such multi-stage decoders may be referred to herein as late reliability decoders and are described in Nguyen et al. U.S. patent application Ser. No. 14/197,408, filed Mar. 5, 2014, which is hereby incorporated by reference in its entirety.

After processing, each symbol in the decoded message 128 should be assigned as one state in a set of possible states. When input into the model $Hc=\vec{0}$ as c, the decoded message 128 satisfies the model. Suitable systems and processes for performing decoding are described in relation to FIGS. 3-5.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2:
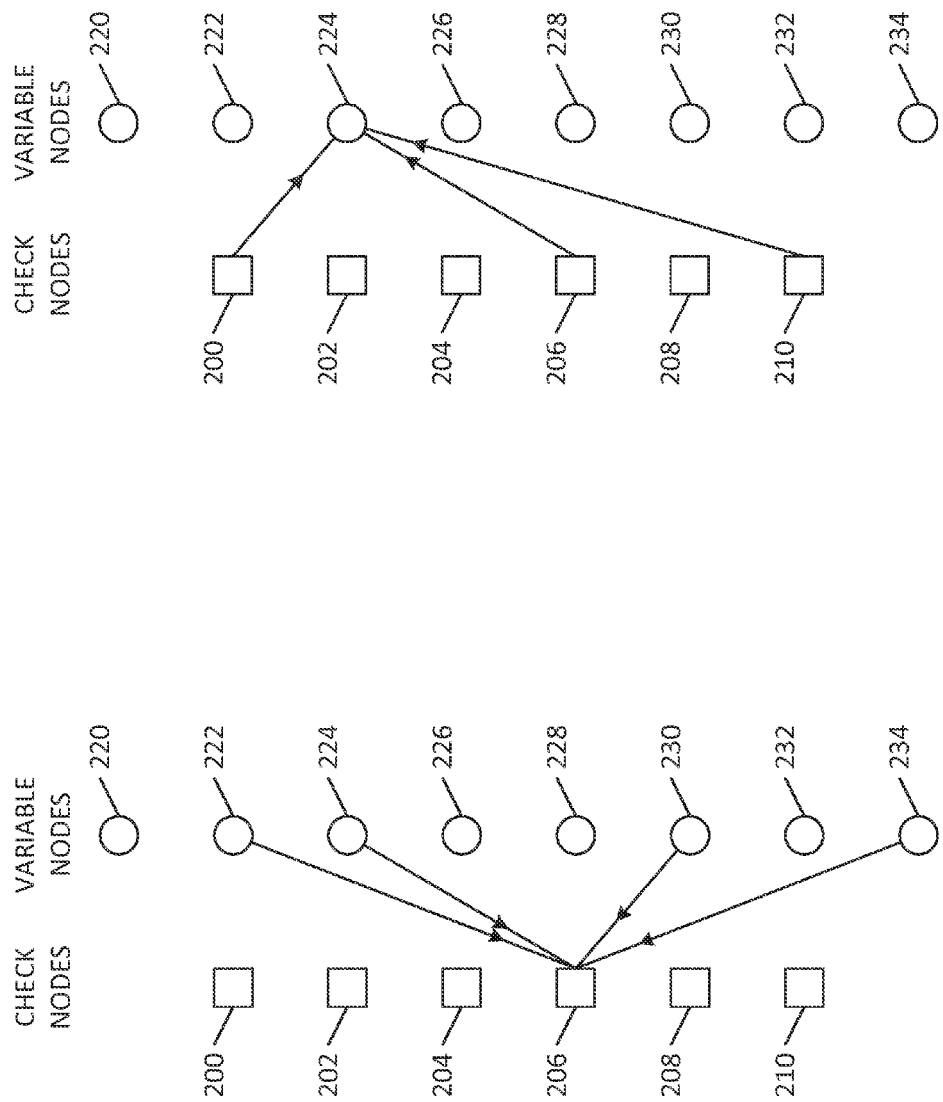
FIGS. 2A and 2B are graphical illustrations of communications between variable nodes representing symbols of a received codeword and check nodes for decoding the received codeword, in accordance with an embodiment of the present disclosure.

FIGS. 2A and 2B are graphical illustrations of communications between variable nodes 220-234 representing an example codeword and check nodes 200-210 for decoding the codeword using variable reliability information, in accordance with an embodiment of the present disclosure.

Upon initialization of the decoding process, variable nodes 220-234 are assigned input states using the detector 120 as described in relation to FIG. 1, where both hard decision and reliability information may be taken into account. As discussed herein, a "variable node value" refers to the hard decision associated with a variable node, while "variable reliability data" refers to the reliability data associated with the variable node or variable node value. An input state may include one or both of the variable node value and the variable reliability data.

In one illustrative example, every variable node is associated with a two-bit input denoted by $[b_1 \, b_0]$, where the value of the bit $b_0$ indicates the hard decision and the value of the bit $b_1$ indicates the reliability of the hard decision. In a binary code, $b_0$ may take on values 0 or 1, representing the two possible hard decision states of a decoded bit. Correspondingly, $b_1$ may also take on values 0 or 1, where 0 represents an unreliable hard decision, and 1 represents a reliable hard decision. In other words, an input of 10 to a variable node may be interpreted as a reliable decision of 0, an input of 00 to a variable node may be interpreted as an unreliable decision of 0, an input of 01 to a variable node may be interpreted as an unreliable decision of 1, and an input of 11 to a variable node may be interpreted as a reliable decision of 1. In general, any number (k) of reliability bits may be used, and the (k+1)-bit input may be denoted by: $[b_k \, b_{k-1} \ldots b_1 \, b_0]$.

Hard decoding systems perform decoding on the hard decision data, while soft decoding systems perform decoding on both the hard decision data as well as the reliability data. In the multi-stage decoder of the present disclosure, the decoder may perform hard decoding when only the hard decision data is available, and perform soft decoding as the reliability data becomes available. In particular, in some systems, such as certain flash memory units, the hard decision data is made available to the decoder before the corresponding reliability data is available. This may occur because the hard decision is available after the channel 114 is read a single time, and the reliability data is only available after a number of additional reads. In an example, a single additional read may be sufficient to render one bit of reliability data, and further additional reads may render additional bits of reliability data.

The system requirements for performing each read may be associated with a higher cost than performing the actual decoding. For example, the time it takes to perform a single read may be significantly longer than the time it takes to perform the decoding. Because hard decoding may be successful in recovering a valid codeword after receiving only the hard decision and before any reliability data is received, it may be desirable to determine whether hard decoding has been successful before performing any additional reads to recover reliability data. Similarly, if soft decoding is successful after a certain number of reads, it may be undesirable to perform additional unnecessary reads. In a system with throughput and power constraints, the multi-stage decoder of the present disclosure provides for efficient decoding by making use of the hard decision data and the reliability data as it is received.

The hard decision and reliability data input may be stored together in one memory location as input states, or separately in a hard decision memory and a reliability data memory. As described herein, only one bit is used to represent the hard decision and only one bit is used to represent the reliability of the hard decision. However, in general, any number of bits may be used to represent the hard decision, the reliability, or both. In particular, the hard decision may take on more than two values for non-binary codes, and the reliability messages may carry one or more bits or symbols.

After the variable nodes 220-234 are assigned input states using the detector 120 as described in relation to FIG. 1, a check of the variable nodes is performed by the decoder 124 on a plurality of groups of variable nodes. The decoder 124 uses processing rules to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B and for a binary code example, the parity check matrix H 126 may be as follows $$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. With binary codes, the elements of the parity check matrix are 0 or 1, as shown above. As used herein, a "neighboring" check node of a variable node is a check node that has a connection to the variable node. Similarly, a "neighboring" variable node of a check node is a variable node that has a connection to the check node. The parity check matrix H 126 shown above provides indications of the connections between check nodes and variable nodes. In particular, as shown in FIG. 2A, variable nodes 222, 224, 230, and 234 are neighbors of check node 206, and as shown in FIG. 2B, check nodes 200, 206, and 210 are neighbors of variable node 224. Furthermore, in binary codes, each check node has one of two states, 0 if the check is satisfied, and 1 if the check is unsatisfied. For a non-binary code, the elements of the parity check matrix are non-binary, and each check node is one of more than two states. Each row of the parity check matrix forms the coefficients of a parity check equation, which is computed in the non-binary domain.

The decoder 124 references the parity check matrix H 126 to identify variable nodes associated with a particular check node, or variable nodes that should be checked by the particular check node. For example, for the check node 206, the decoder 124 uses fourth row of the parity check matrix H 126 to determine that that check node 206 stores the result of a check of variable nodes 222, 224, 230, and 234 (i.e., the second, third, sixth, and eighth variable nodes). Then, the decoder 124 retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. The variable node values are retrieved by the decoder 124, which processes the values on behalf of the check node 206 according to the processing rules.

From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" or the "check node value" of the check node) is stored in syndrome memory, which stores syndrome values or indications of the check nodes. In addition, reliability of the syndrome values of the check nodes may be updated based on values and reliability of associated variable nodes.

After the indications or syndrome values for the check nodes 200-210 have been stored in the syndrome memory, the values of the variable nodes 220-234 may be updated based on the values of the check nodes and reliability of the variable nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth variable nodes) should be referenced. Based on the indications of the referenced check nodes, the state of the variable node 224 may be updated.

In some embodiments of the present disclosure, the value of the variable node 224 may also be determined based, in part, on whether the variable node 224 had previously been updated, toggled, or flipped. The check nodes and variable nodes may be iteratively updated until all check nodes are satisfied (i.e., an all-zero syndrome is achieved) or until a maximum number of iterations has been reached. The output of the decoder 124 is the content of the hard-decision memory upon termination of the decoding process, or the decoded message 128.

Figure 3:
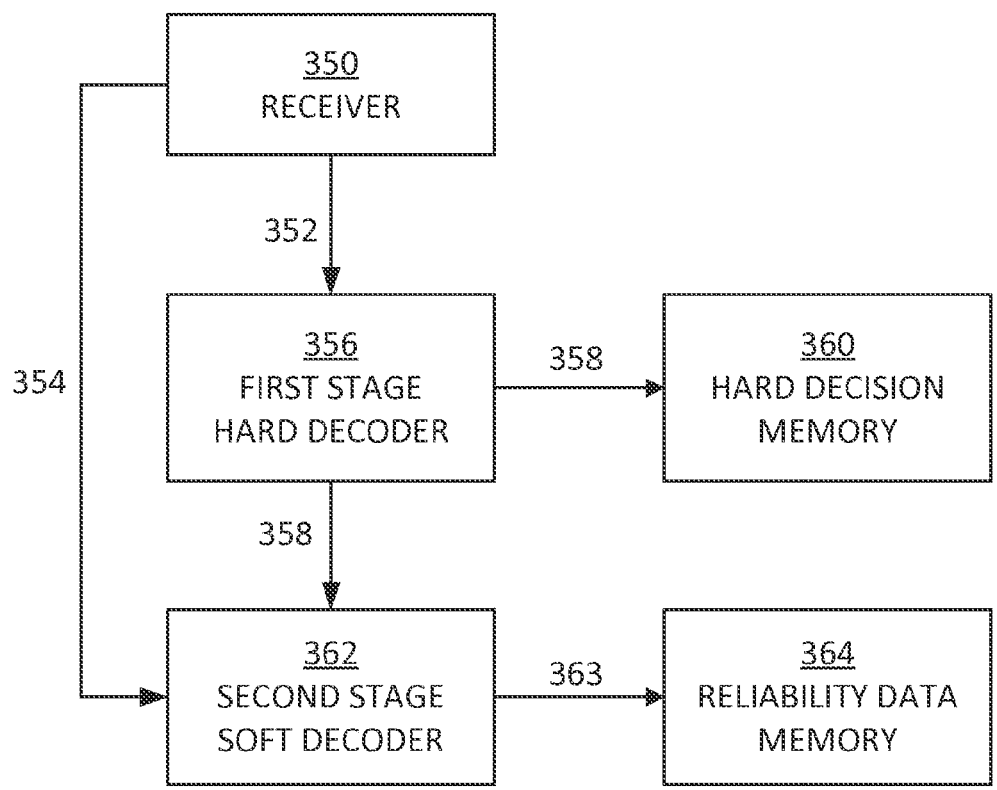
FIG. 3 is a block diagram of an illustrative system for multi-stage decoding, in accordance with an embodiment of the present disclosure.

FIG. 3 is a block diagram of an illustrative multi-stage decoder system 300 for decoding using late reliability inputs, in accordance with an embodiment of the present disclosure. System 300 may implement the decoding process as described in relation to FIG. 1 or as illustrated by FIGS. 2A and 2B. Receiver 350 receives hard decision data and reliability data as one or more reads of channel 114 are performed. Because hard decision data result from a single read and reliability data result from multiple reads, hard decision data (denoted $b_o$) are received before the reliability data (denoted $[b_k\ b_{k-1}\ \ldots\ b_1]$) are received.

A first stage hard decoder 356 of the multi-stage decoder receives the hard decision data 356 from the receiver 350 and performs hard decoding. First stage hard decoder 356 may perform hard decoding by determining whether to update a variable node value based on whether a number of check nodes associated with the variable node are satisfied or unsatisfied. In an example, the value of one or more variable nodes may be selectively updated based on which combination of updated variable node values would be most likely to reduce the number of unsatisfied check nodes. First stage hard decoder 356 outputs updated hard decisions 358, which are stored in hard decision memory 360 and are optionally transmitted to second stage soft decoder 362. In some embodiments, first stage hard decoder 356 is configured to determine that decoding is successful, and decoding is terminated. As an example, decoding may be determined to be successful when an all-zero syndrome is achieved.

Second stage soft decoder 362 receives reliability data 354 from receiver 350 and updated hard decisions 358 from first stage hard decoder 356. Second stage soft decoder 362 performs soft decoding based on the reliability data 354 and the hard decisions 358. The soft decoding performed by second stage soft decoder 362 may include determining whether to update the hard decisions 358, the reliability data 354, or both, based on one or more update rules. In an example, an update rule may be based on whether check nodes associated with a variable node are satisfied or unsatisfied, whether the variable node has been previously updated based on the reliability data, or a combination thereof. The output of second stage soft decoder 362 may include updated reliability data 363, which are stored in reliability data memory 364. Moreover, if second stage soft decoder 362 updated the hard decisions 358, second stage soft decoder 362 may store the updated hard decisions in hard decision memory 360.

As shown in FIG. 3, a single second stage soft decoder 362 is used. However, in general, any number of additional second stage soft decoders may be used as additional reliability data are received. In particular, for k incoming bits of reliability data, k stages of soft decoders may be used, each associated with a corresponding number of reliability data bits. In an example, the multi-stage decoder as described herein includes at least two stage decoders with different throughput characteristics. In particular, a first stage decoder (such as first stage hard decoder 356, for example) may be associated with high throughput because a small number of bits (one bit, for example) are processed at a time. A second stage decoder (such as second stage soft decoder 362, for example) may be associated with a lower throughput than the first stage decoder because the second stage decoder may be configured to process more bits than the first stage decoder at a time. Alternatively, the first stage decoder and the second stage decoder may have similar throughput, even though the second stage decoder is configured to operate on more inputs than the first stage decoder. In this case, even though the second stage decoder processes more inputs than the first stage decoder, the decoding speed of the first stage decoder and the second stage decoder are similar. This means that the amount of time the first stage decoder and the second stage decoder take to process the same amount of data is similar. Moreover, the multi-stage decoder may include a third stage decoder that is configured to operate on multiple bits of inputs (more than two bits, for example), and is associated with a lower throughput value than the first or second stage decoders. In an example, the third stage decoder may have a throughput value that is 4 to 400 times slower than the throughput of the first stage decoder, the second stage decoder, or both.

Figure 4:
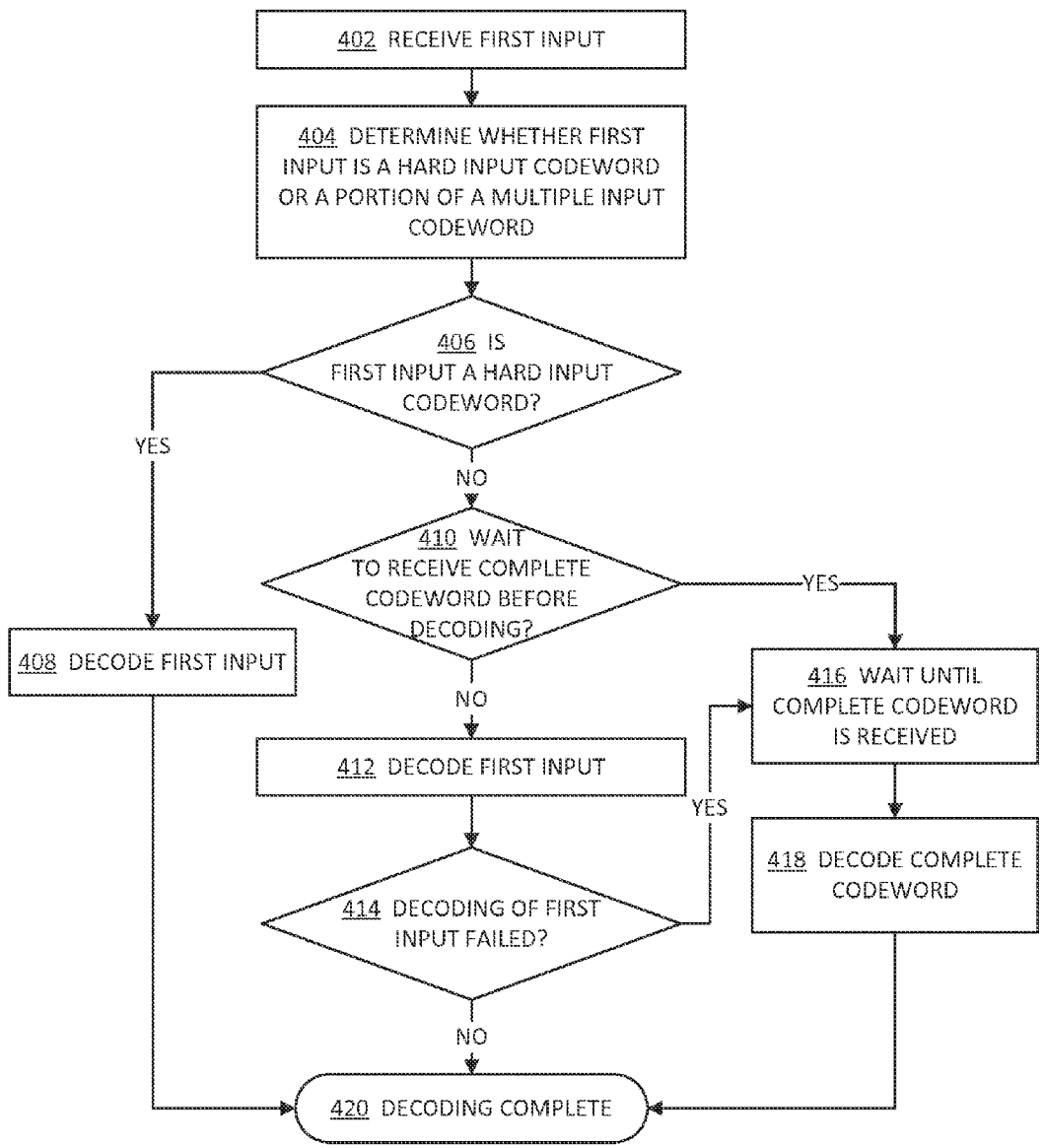
FIG. 4 is a flow chart of an illustrative process for mixed codeword decoding, in accordance with an embodiment of the present disclosure.

In an example, the multi-stage decoder includes a first number of high throughput hard input decoders, a second number of high throughput decoders that operate on two bits of input, and a third number of low throughput decoders that operate on more than two bits of input. The second number and the third number may be smaller than the first number, because only the codewords that fail to be successfully decoded at the first hard input stage are processed by the soft stage decoders. In an example, the first number of high throughput hard input decoders may be replaced with a number of high throughput decoders that are configured to operate on both hard input and two bits of input. The flowchart in FIG. 4 is an example of a mixed codeword approach that can operate on hard input or multiple inputs.

In some embodiments, use of second stage soft decoder 362 and any additional soft decoders are optional. For example, the hard decoding performed by first stage hard decoder 356 may be successful, and thus additional reliability data are not needed. In this case, a controller may be instructed to not perform any additional reads of channel 114 for the current variable node, and second stage soft decoder 362 may be unused. In another example, the soft decoding performed by the n-th stage soft decoder may be successful, where n may be any integer from 1 to k. In this case, any additional reads of channel 114 for the current variable node may not be performed, and the remaining stages of soft decoders (i.e., n+1 through k) may be unused.

In some embodiments, the multi-stage decoder of system 300 is used in relation to reading data from a NAND flash memory unit. In an example, each read results in one bit of information. In particular, the first read gives rise to the hard decision, or the variable node value, or $b_0$. The second read gives rise to a first bit of reliability data, or $b_1$. A controller may interface with the NAND flash memory to read pages of data that are stored in the memory unit. In order to get multiple bits, the controller issues a read command multiple times.

In an example, the controller may parse through a queue of instructions, which may include read instructions such as "READ PAGE 0," "READ PAGE 1," "READ PAGE 2," etc. A hard decoder may determine that when hard decoding of data read from page 0 fails, there is no need to store the result, and the controller may proceed with attempting to decode data read from page 1. In this case, if it is desirable to later perform decoding of data read from page 0, the controller would have to restart the process and request the first read operation to be performed again. This may be wasteful because the amount of time it takes to perform a read operation may significantly exceed the amount of time it takes to perform the decoding, such that the controller's resources may be wasted by forcing the controller to wait while the read operations are performed.

In some embodiments, the NAND flash memory has multiple channels that may independently communicate with the controller. In this case, the controller may initiate a reading instruction to read page 1 (over one of the channels) while simultaneously requesting a second read operation to be performed on page 0 (over another one of the channels). In this manner, the controller is not waiting while the second read operation is performed, and system resources are not wasted.

In some embodiments, the systems described herein include a buffer to store the hard decisions (that result from single reads of the memory) and the reliability data (that result from multiple reads of the memory). Rather than discarding data resulting from one or more read operations, the data is stored in the buffer. In particular, after one or more read operations are performed, the hard decision data and/or the reliability data are stored in the buffer and may be retrieved later so that those one or more read operations do not need to be repeated. In this case, if it is determined that additional reliability data is desirable, then additional read operations may be performed, without having to redo the original one or more read operations. In some embodiments, the NAND flash memory device itself includes a buffer that stores one or more read results. In this case, the data resulting from the read operations is already stored in the NAND device, and the controller only needs to fetch the data when needed.

FIG. 4 is a flow chart of an illustrative process 400 for decoding using a mixed codeword approach, in accordance with an embodiment of the present disclosure. Process 400 may be implemented using the system 300 shown in FIG. 3. In particular, system 300 may be configured to receive a set of codewords, some of which are hard input codewords, and some of which are multiple bit input codewords. The hard input codewords are single bit input codewords, and may be mixed with the multiple bit input codewords. As the codewords are received, system 300 may be configured to differentiate between the hard input codewords and the multiple bit input codewords in an approach that is referred to herein as an "on-the-fly" approach.

At 402, a first input is received. In an example, the first input is one bit, and may be a hard input codeword or portion of a multiple bit input codeword. At 404, system 300 determines whether the first input received at 402 is a hard input codeword or a portion of a multiple bit input codeword. In an example, the first input received at 402 is tagged with information that indicates whether the first input is a hard input codeword or a portion of a multiple bit input codeword. The tag may further provide the number of bits in the multiple bit input codeword, or an indication of which portion of the multiple bit input codeword corresponds to the first input.

At 406, if the system determines that the first input is a hard input codeword, the first input is decoded at 408. Otherwise, if the system determines that the first input is a portion of a multiple bit input codeword, then the system determines whether to wait until the complete codeword is received before decoding at 410. If so, then the system waits until the complete codeword is received at 416 and performs decoding of the complete codeword at 418. Decoding of the current codeword is completed at 420.

Otherwise, the system may be configured to select to not wait until the complete codeword is received before beginning the decoding process. In this case, the first input is decoded at 412. If the decoding of the first input at 412 fails (414), then the system may wait until the complete codeword is received at 416 and decode the complete codeword at 418. Decoding of the current codeword is completed at 420. Alternatively, if the complete codeword includes more than two-bit inputs, then the system may be configured to attempt to decode as each additional bit is received, rather than waiting for the complete codeword to be received.

In an example, if the decoding of the first input at 412 fails (414), the first input may be discarded, and the system may request for another hard decision input to be received. The request for another hard decision input may cause another read operation to be performed on a NAND flash memory unit. Alternatively, if the decoding of the first input at 412 fails (414), the system may store a result of the decoding in a hard decision memory and continue to receive and decode other codewords. The system may identify additional inputs that are received that correspond to the same codeword as the first input are received, retrieve the result from the hard decision memory, and continue attempting to decode the codeword. The additional inputs that are received may include additional hard decision inputs, soft information, or both. The decoding may be successful at any point as the additional inputs are received. Whenever the decoding is successful, or when the decoding has failed even after attempting to decode using all the inputs associated with a codeword, decoding is complete at 420.

FIG. 5 is a flow chart of an illustrative process 500 for multi-stage decoding, in accordance with an embodiment of the present disclosure. Process 500 may be implemented using the system 300 shown in FIG. 3. At 502, a first decoder attempts to decode data based on a hard decision input for a symbol. In some embodiments, the hard decision input for the symbol is received after transmitting an instruction to perform a read operation on a memory. In particular, the memory may be a NAND flash memory device, and a controller may instruct the NAND flash memory device to perform a read operation and transmit the result of the read operation (i.e., a hard decision) to the controller.

In some embodiments, the first decoder's attempt to decode the data based on the hard decision input is not based on any reliability data. A result of the hard decoding scheme may include an updated hard decision value. The originally received hard decision and/or the updated hard decision value may be stored in a buffer such as hard decision memory 360 shown in FIG. 3. In some embodiments, the first decoding scheme includes evaluating whether the hard decoding is successful, such as by determining whether an all-zero syndrome is achieved, for example. If the hard decoding is successful, process 500 may be terminated, and 504, 506, and 508 may not be performed. Otherwise, if the hard decoding is unsuccessful (which may be determined if an all-zero syndrome is not achieved, for example), 504, 506, and 508 are performed.

At 504, a transmitter transmits a request for reliability information for the symbol when the attempting to decode the data based on the hard decision input at 502 fails, and at 506, a receiving circuitry receives the reliability information for the symbol. In some embodiments, transmitting the request for reliability information includes transmitting an instruction to perform additional read operations on a memory. When the memory is a NAND flash memory device, a controller may instruct the NAND flash memory device to perform one or more additional read operations and transmit the results of the additional read operations to the controller in the form of reliability data.

At 508, a second decoder decodes the data based on the reliability information. In an example, the second decoder may decode the data using a combination of the hard decision input used at 502 and the reliability information received at 506. In this case, when the first decoder's attempt to decode the data fails, the hard decision input used at 502 may be stored in a hard decision memory. For example, a memory unit such as hard decision memory 360 shown in FIG. 3 may be used to store the hard decision input, and the second decoder may be configured to retrieve the hard decision input from the memory.

In another example, when the first decoder's attempt to decode the data based on the hard decision input at 502 fails, the hard decision input may be discarded, and the request transmitted at 504 for reliability information may also include a request for another reading of the hard decision input. In this case, a second hard decision input is received at 506, and the second decoder decodes the data using a combination of the second received hard decision input and the reliability information for the symbol.

In some embodiments, additional reliability data for the variable node is received at a third time later than the second time. If decoding at the second stage (i.e., the decoding using the second decoding scheme) was unsuccessful, then the variable node may be decoded using a third decoding scheme after the third time. As described herein, any number of additional stages may be used for receiving additional reliability data (resulting from additional reads of a memory, for example) and for further decoding the variable node. When the decoding is successful, or when a maximum number of stages has been used or a maximum number of additional reads has been performed, the decoding process is terminated.

In some embodiments, the systems and methods of the present disclosure include a mechanism of differentiating between different types of codewords. In an example, a hard decision input for the symbol may be represented by one bit of data, and the reliability information may be represented by another bit of data. In this case, system 300 may receive a mixed set of While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for decoding data, comprising:
    attempting, using a first decoder, to decode the data based on a hard decision input for a symbol;
    transmitting a request for reliability information for the symbol when the attempting to decode the data based on the hard decision input fails and when the data indicates the reliability information exists;
    receiving, with receiving circuitry, the reliability information for the symbol; and
    decoding, using a second decoder, the data based on the reliability information.

2. The method of claim 1, wherein when the attempting to decode the data based on the hard decision input for the symbol fails, the method further comprises discarding the hard decision input for the symbol and transmitting a request for another hard decision input for the symbol.

3. The method of claim 1, wherein the second decoder decodes the data based on the hard decision input and the reliability information.

4. The method of claim 1, wherein when the attempting to decode the data based on the hard decision input for the symbol fails, the method further comprises storing the hard decision input in memory.

5. The method of claim 1, further comprising receiving, with the receiving circuitry, the hard decision input for the symbol after an instruction to perform a read operation on a memory is transmitted.

6. The method of claim 1, wherein the reliability information is obtained by performing one or more additional read operations on a memory.

7. The method of claim 1, wherein in response to determining that the hard decision input is a portion of a codeword that further includes the reliability information, the method further comprises waiting until the reliability information is received before attempting to decode the data.

8. The method of claim 1, wherein when the first decoder successfully decodes the data based on the hard input for the symbol, the method further comprises terminating the decoding without transmitting the request for the reliability information.

9. The method of claim 1, wherein the reliability information includes at least two bits.

10. A system for decoding data, comprising:
    a first decoder configured to attempt to decode the data based on a hard decision input for a symbol;
    a transmitter configured to transmit a request for reliability information for the symbol when the attempting to decode the data based on the hard decision input fails and when the data indicates the reliability information exists;
    a receiver configured to receive the reliability information for the symbol; and
    a second decoder configured to decode the data based on the reliability information.

11. The system of claim 10, wherein when the first decoder fails to decode the data based on the hard decision input, the first decoder is further configured to discard the hard decision input for the symbol and the transmitter is further configured to transmit a request for another hard decision input for the symbol.

12. The system of claim 10, wherein the second decoder decodes the data based on the hard decision input and the reliability information.

13. The system of claim 10, wherein when the first decoder fails to decode the data based on the hard decision input, the system further comprises memory configured to store the hard decision input.

14. The system of claim 10, wherein the hard decision input for the symbol is received after transmitting an instruction to perform a read operation on a memory.

15. The system of claim 14, wherein the memory is a NAND flash memory.

16. The system of claim 10, wherein the reliability information is obtained by performing one or more additional read operations on a memory.

17. The system of claim 10, wherein the first decoder and the second decoder have substantially similar throughputs.

18. The system of claim 10, wherein in response to determining that the hard decision input is a portion of a codeword that further includes the reliability information, the first decoder is configured to wait until the reliability information is received before attempting to decode the data.

19. The system of claim 10, wherein when the first decoder successfully decodes the data based on the hard input for the symbol, the system terminates the decoding without the transmitter transmitting the request for the reliability information.

20. The system of claim 10, wherein the reliability information includes at least two bits.

* * * * *